(12) United States Patent
Hioka (10) Patent No.: US 10,236,440 B2
(45) Date of Patent: Mar. 19, 2019

(54) SEMICONDUCTOR DEVICE

(71) Applicant: ABLIC Inc., Chiba-shi, Chiba (JP)

(72) Inventor: Takaaki Hioka, Chiba (JP)

(73) Assignee: ABLIC INC., Chiba-Shi (JP)

(*) Notice: Subject to any disclaimer, the term of this patent is extended or adjusted under 35 U.S.C. 154(b) by 0 days.

(21) Appl. No.: 15/901,446

(22) Filed: Feb. 21, 2018

(65) Prior Publication Data
US 2018/0254408 A1    Sep. 6, 2018

(30) Foreign Application Priority Data

Mar. 1, 2017 (JP) .................................. 2017-038543

(51) Int. Cl.
| | |
|---|---|
| *H01L 43/06* | (2006.01) |
| *H01L 27/22* | (2006.01) |
| *H01L 43/04* | (2006.01) |
| *G01R 33/07* | (2006.01) |

(52) U.S. Cl.
CPC .......... *H01L 43/065* (2013.01); *G01R 33/077* (2013.01); *H01L 27/22* (2013.01); *H01L 43/04* (2013.01)

(58) Field of Classification Search
CPC ....... H01L 43/065; H01L 43/04; H01L 27/22; G01R 33/077
See application file for complete search history.

(56) References Cited

U.S. PATENT DOCUMENTS

| | | |
|---|---|---|
| 2014/0210023 A1 | 7/2014 | Wang |
| 2016/0018478 A1 | 1/2016 | Hebert |
| 2016/0146906 A1 | 5/2016 | Suzuki et al. |

FOREIGN PATENT DOCUMENTS

| | | |
|---|---|---|
| JP | 5966060 B2 | 8/2016 |

OTHER PUBLICATIONS

Extended European Search Report for European Application No. 18154041.0, dated Aug. 14, 2018, pp. 1-5.

*Primary Examiner* — Hrayr A Sayadian
(74) *Attorney, Agent, or Firm* — Brinks Gilson & Lione (57) ABSTRACT

The vertical Hall element includes: a second conductivity type semiconductor layer; electrodes aligned along a straight line in a surface of the semiconductor layer, and each include a second conductivity type impurity region that is higher in concentration than semiconductor layer; and first conductivity type electrode isolation diffusion layers isolating the electrodes from one another, each of the electrode isolation diffusion layers being provided between each pair of the electrodes in the surface of the semiconductor layer, the electrodes including an electrode that functions as a drive current supply electrode and an electrode that functions as a Hall voltage output electrode, the drive current supply electrode and the Hall voltage output electrode being arranged alternately, the Hall voltage output electrode having a first depth, the drive current supply electrode having a second depth that is larger than the first depth and a depth of the electrode isolation diffusion layers.

11 Claims, 5 Drawing Sheets

SEMICONDUCTOR DEVICE

RELATED APPLICATIONS

This application claims priority under 35 U.S.C. § 119 to Japanese Patent Application No. 2017-038543 filed on Mar. 1, 2017, the entire content of which is hereby incorporated by reference.

BACKGROUND OF THE INVENTION

1. Field of the Invention

The present invention relates to a semiconductor device, and more particularly, to a semiconductor device that includes a vertical Hall element configured to detect a magnetic field in a horizontal direction.

2. Description of the Related Art

A Hall element is capable of detecting position or angle without contact as a magnetic sensor, and accordingly has various uses. While magnetic sensors that use a horizontal Hall element configured to detect magnetic field components perpendicular to a semiconductor substrate surface (vertical magnetic field) are particularly well known, there have been proposed various magnetic sensors that use a vertical Hall element configured to detect magnetic field components parallel to a substrate surface (horizontal magnetic field).

A vertical Hall element is generally configured to detect a horizontal magnetic field by utilizing both of a current that flows in a direction perpendicular to a substrate and a current that flows in a direction parallel to the substrate.

Meanwhile, in recent years, there has been proposed the following vertical Hall element, which is disclosed in Japanese Patent No. 5966060, for example. In the vertical Hall element, a current that flows in a direction perpendicular to a substrate is reduced while a current that flows in a direction parallel to the substrate is increased, and the vertical Hall element is configured to detect a horizontal magnetic field by positively utilizing the increased current in the direction parallel to the substrate.

The vertical Hall element disclosed in Japanese Patent No. 5966060 includes trenches formed in the semiconductor substrate, an insulating film formed on the inner side surface of each of the trenches, a conductor embedded in each of the trenches via the insulating film, and a high-concentration contact region connected to the conductor and formed in the bottom portion of each of the trenches. The conductor embedded in each of the trenches and the contact region connected thereto function as a drive current supply electrode.

In such a configuration, when a current is supplied between two drive current supply electrodes, the current flows between the contact regions formed in the bottom portions of the trenches. Hence, this configuration can almost completely eliminate current components in the direction perpendicular to the surface of the substrate and cause most of the current to flow in the direction parallel to the surface of the substrate.

The structure of Japanese Patent No. 5966060, however, has a problem given below.

As described above, when a current is supplied between the two drive current supply electrodes, most of the current flows in the direction parallel to the surface of the substrate. This current (flow) concentrates in particular along the shortest path between the contact regions in the semiconductor substrate, which is a magnetism sensing portion. This means that almost no current flows to regions of the magnetism sensing portion that are located below the contact regions and are near the rear surface of the substrate. Further, the insulating film is formed on the inner side surface of the trench, in which the conductor of the drive current supply electrode is embedded, and hence the current hardly flows to a region of the magnetism sensing portion that is located between the side walls of the two trenches. As a result, the current that flows in the direction parallel to the substrate has a small width in a depth direction of the substrate.

The magnetic sensitivity of a Hall element is known to rise in proportion to the width of a current that flows through the Hall element. In the structure of Japanese Patent No. 5966060, however, the width of the current that flows in the direction parallel to the substrate is small as described above, and as a result, the sensitivity is only slightly improved.

SUMMARY OF THE INVENTION

It is therefore an object of the present invention to provide a semiconductor device including a vertical Hall element that is improved in sensitivity obtained by a current that flows in a direction parallel to a substrate.

In one embodiment of the present invention, there is provided a semiconductor device including: a semiconductor substrate of a first conductivity type; and a vertical Hall element formed on the semiconductor substrate, the vertical Hall element including: a semiconductor layer of a second conductivity type formed on the semiconductor substrate; a plurality of electrodes aligned along a straight line in a surface of the semiconductor layer, each of the plurality of electrodes including an impurity region of the second conductivity type that has a concentration that is higher than the concentration of the semiconductor layer; and a plurality of electrode isolation diffusion layers of the first conductivity type isolating the plurality of electrodes from one another, each of the plurality of electrode isolation diffusion layers being provided between each pair of the plurality of electrodes in the surface of the semiconductor layer, wherein the plurality of electrodes comprises an electrode that functions as a drive current supply electrode and an electrode that functions as a Hall voltage output electrode, the drive current supply electrode and the Hall voltage output electrode being arranged alternately, the Hall voltage output electrode has a first depth, and the drive current supply electrode has a second depth that is larger than the first depth and a depth of the plurality of electrode isolation diffusion layers.

According to the present invention, the drive current supply electrode is larger in depth than those of the Hall voltage output electrode and the electrode isolation diffusion layers in the second conductivity type semiconductor layer. Consequently, when a current flows between two drive current supply electrodes, the current flows in the direction parallel to the substrate, and flows widely in the semiconductor layer in its depth direction. That is, the current flows over the entire region from the bottom portions of the electrode isolation diffusion layers to the bottom portions of drive current supply electrodes. The magnetic sensitivity of the Hall element can therefore be increased.

BRIEF DESCRIPTION OF THE DRAWINGS

Embodiments of the invention will now be described, by way of example, with reference to the accompanying drawings, in which.

DETAILED DESCRIPTION OF THE EMBODIMENTS

The invention will be now described herein with reference to illustrative embodiments.

[First Embodiment]

Figure 1A:
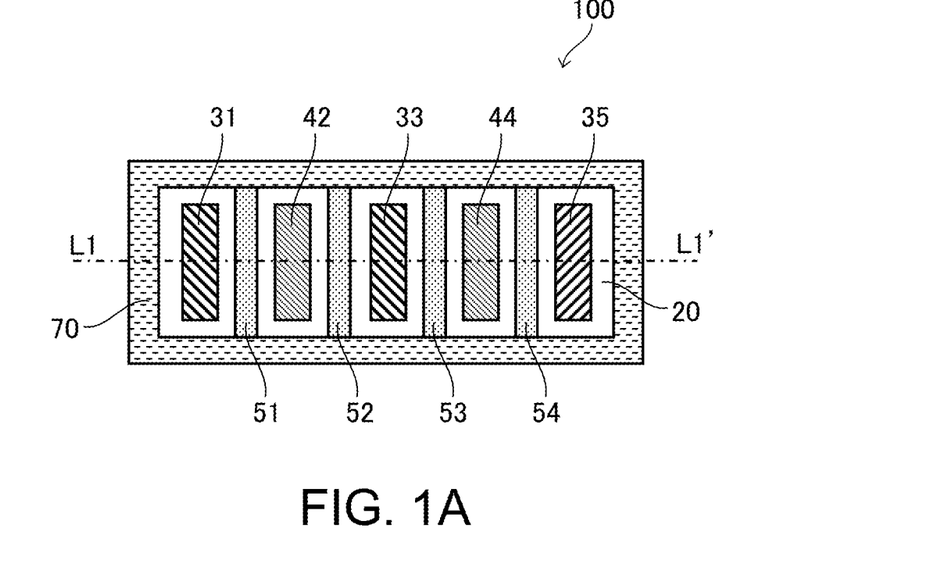
FIG. 1A is a plan view of a semiconductor device that includes a vertical Hall element according to a first embodiment of the present invention.
Figure 1B:
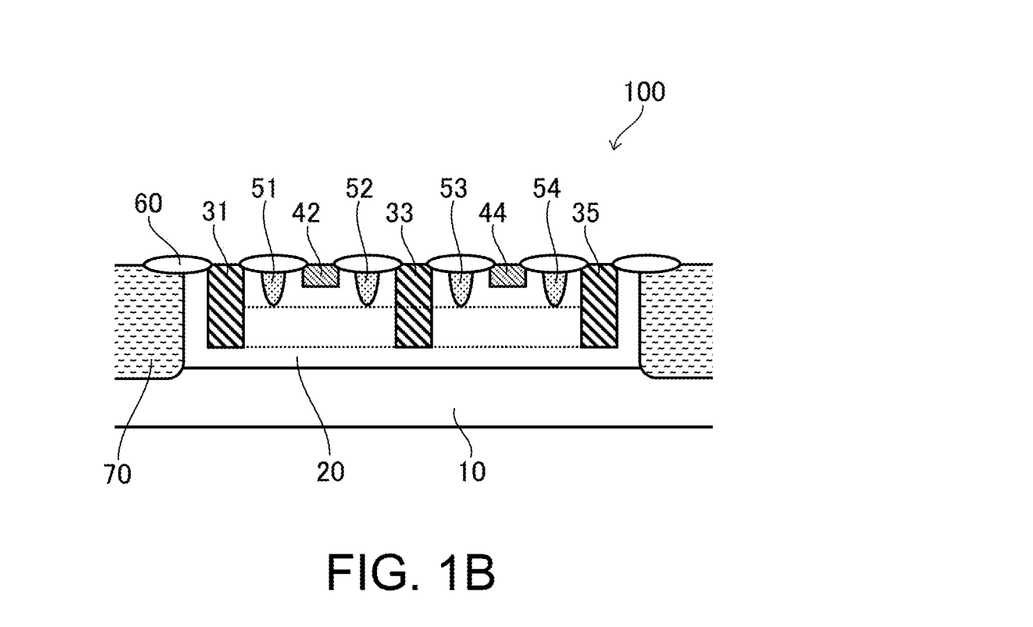
FIG. 1B is a cross-sectional view taken along the line L1-L1' of FIG. 1A.

FIG. 1A and FIG. 1B are views for illustrating a semiconductor device that includes a vertical Hall element 100 according to a first embodiment of the present invention. FIG. 1A is a plan view of the semiconductor device, and FIG. 1B is a sectional view taken along the line L1-L1' of FIG. 1A.

The semiconductor device of the first embodiment includes, as illustrated in FIG. 1A and FIG. 1B, a P-type (first conductivity type) semiconductor substrate 10, the vertical Hall element 100 provided on the semiconductor substrate 10, and a P-type element isolation diffusion layer 70 formed so as to surround the periphery of the vertical Hall element 100.

The vertical Hall element 100 includes an N-type (second conductivity type) semiconductor layer 20, electrodes 31, 33, 35, 42, and 44, and P-type electrode isolation diffusion layers 51 to 54. The N-type semiconductor layer 20 is formed on the semiconductor substrate 10. The electrodes 31, 33, 35, 42, and 44 are N-type impurity regions aligned along a straight line L1-L1' in a surface of the N-type semiconductor layer 20. The P-type electrode isolation diffusion layers 51 to 54 are configured to isolate the electrodes 31, 33, 35, 42, and 44 from one another.

Of the electrodes 31, 33, 35, 42, and 44, the electrodes 31, 33, and 35 are electrodes that function as drive current supply electrodes, and the electrodes 42 and 44 are electrodes that function as Hall voltage output electrodes. The drive current supply electrodes 31, 33, and 35 and the Hall voltage output electrodes 42 and 44 are alternately aligned along the straight line L1-L1', as illustrated in FIG. 1A.

The drive current supply electrodes 31, 33, and 35 are formed to have a depth that is larger than those of the Hall voltage output electrodes 42 and 44 and the electrode isolation diffusion layers 51 to 54.

Further, the drive current supply electrodes 31, 33, and 35 have a concentration that is substantially equal to the concentration of the Hall voltage output electrodes 42 and 44.

The vertical Hall element 100 further includes an insulating film, for example, an SiO$_2$ film 60, so as to cover a surface of the N-type semiconductor layer 20, except for regions in which the electrodes 31, 33, 35, 42, and 44 are formed. This suppresses a current that flows in parallel to the semiconductor substrate 10 in the surface of the N-type semiconductor layer 20.

The element isolation diffusion layer 70 is formed so as to reach the P-type semiconductor substrate 10 in depth past the bottom of the N-type semiconductor layer 20. This electrically isolates the vertical Hall element 100 from other regions (not shown) on the semiconductor substrate 10.

In this vertical Hall element 100, the P-type electrode isolation diffusion layers 51 to 54 are formed by, for example, selectively diffusing P-type impurities in the N-type semiconductor layer 20.

Further, the drive current supply electrodes 31, 33, and 35 and the Hall voltage output electrodes 42 and 44 are formed as follows, for example.

First, after the P-type electrode isolation diffusion layers 51 to 54 are formed, the SiO$_2$ film 60 is formed, for example, by LOCOS so that the SiO$_2$ film 60 covers the P-type electrode isolation diffusion layers 51 to 54 while avoiding regions in which the electrodes 31, 33, 35, 42, and 44 are to be formed. N-type impurities are then introduced with the SiO$_2$ film 60 used as a mask. The Hall voltage output electrodes 42 and 44 are formed in this way. At this time, N-type impurity regions that have the same depth as those of the Hall voltage output electrodes 42 and 44 are also formed in the regions in which the drive current supply electrodes 31, 33, and 35 are to be formed. Here, the Hall voltage output electrodes 42 and 44 are formed to have a depth that is smaller than the depth of the P-type electrode isolation diffusion layers 51 to 54.

Subsequently, a resist having openings over the regions in which the drive current supply electrodes 31, 33, and 35 are to be formed and covering the Hall voltage output electrodes 42 and 44 is formed. The N-type impurities are then introduced deeply with the resist used as a mask. The drive current supply electrodes 31, 33, and 35 are formed in this way.

A description given next is about the principle of detecting a magnetic component that is in a direction parallel to the semiconductor substrate 10 in the vertical Hall element 100 of the semiconductor device according to the first embodiment.

In FIG. 1B, it is assumed that a magnetic field is applied from the back side to the front side on the drawing sheet in the direction parallel to the semiconductor substrate 10.

When a drive current is supplied to the drive current supply electrodes 31, 33, and 35 so that the current flows from the drive current supply electrode 33 to the drive current supply electrodes 31 and 35, the current flows from the drive current supply electrode 33 to the drive current supply electrodes 31 and 35 in the directions parallel to the semiconductor substrate 10 (leftward and rightward directions) in the N-type semiconductor layer 20, which is the magnetism sensing portion.

At this time, the current flows in the entire region from the bottom portions of the P-type electrode isolation diffusion layers 51 to 54 to the bottom portions of the drive current supply electrodes 31, 33, and 35, which is illustrated by the dotted lines in FIG. 1B. In short, the current widely flows in a depth direction of the semiconductor layer 20.

The magnetic field acts on the current which flows as described above, to thereby generate an electromotive force in a direction perpendicular to the current and the magnetic field both.

Specifically, in the first embodiment, a Lorentz force is generated in a direction from the semiconductor substrate 10 to the Hall voltage output electrode 42 (upward direction) for the current that flows from the drive current supply electrode 33 to the drive current supply electrode 31 in the direction parallel to the semiconductor substrate 10, and a Lorentz force is generated in a direction from the Hall voltage output electrode 44 to the semiconductor substrate 10 (downward direction) for the current that flows from the drive current supply electrode 33 to the drive current supply electrode 35 in the direction parallel to the semiconductor substrate 10.

Consequently, a potential difference is generated between the Hall voltage output electrodes 42 and 44, and the magnetic field can be detected with the potential difference.

As described above, the first embodiment can increase the width in the depth direction of the current that flows in the direction parallel to the semiconductor substrate.

The magnetic sensitivity of a Hall element is in proportion to the width of a current that flows through the Hall element, and hence, according to the first embodiment, high magnetic sensitivity can be obtained. Thus, the N-type semiconductor layer 20 is preferably as thick as possible.

In the first embodiment, it is desired for the current to uniformly flow over the entire region illustrated by the dotted lines in FIG. 1B. Thus, the N-type semiconductor layer 20 preferably has a constant concentration distribution. The N-type semiconductor layer 20 with a constant concentration distribution can be achieved by making the N-type semiconductor layer 20 an epitaxial layer, for example.

In addition, the magnetic sensitivity of a Hall element is known to rise also in proportion to mobility. Hence, the concentration of the N-type semiconductor layer 20, which is the magnetism sensing portion, is preferably as low as possible, and is preferably from about $1\times10^{15}$ atoms/cm$^3$ to about $1\times10^{17}$ atoms/cm$^3$, for example.

As described above, the first embodiment increases the width in the depth direction of the current that flows in the direction parallel to the semiconductor substrate, thereby being capable of increasing the magnetic sensitivity of the vertical Hall element.

Figure 2:
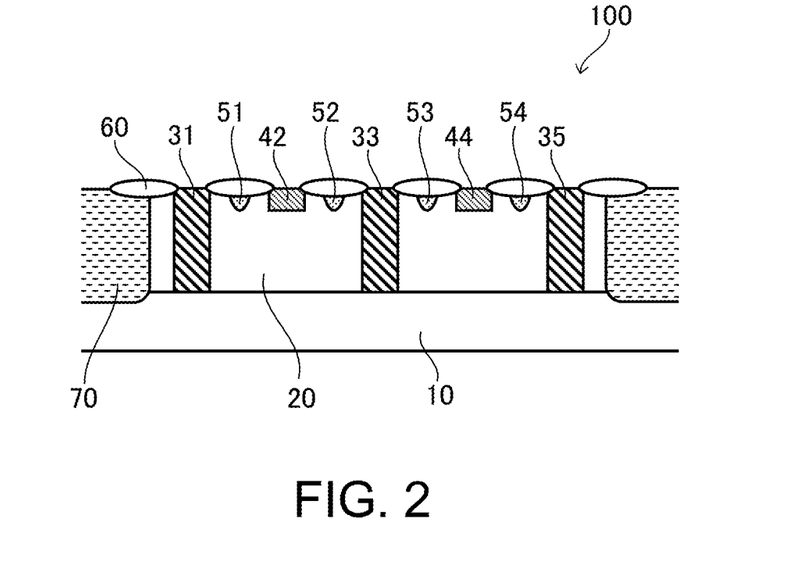
FIG. 2 is a cross-sectional view taken along the line L1-L1' of FIG. 1A, for illustrating a modification example of the vertical Hall element illustrated in FIG. 1A and FIG. 1B.

FIG. 2 is an illustration of a modification example of the vertical Hall element 100 of the first embodiment. FIG. 2 is a cross-sectional view taken along the line L1-L1' of FIG. 1A.

As illustrated in FIG. 2, in this modification example, the drive current supply electrodes 31, 33, and 35 have a depth that is substantially equal to the depth of the N-type semiconductor layer 20. This configuration allows a current to flow to near the boundary between the semiconductor layer 20 and the semiconductor substrate, and can achieve a large width in the depth direction of a current that flows in the direction parallel to the semiconductor substrate as compared to the example illustrated in FIG. 1B.

In addition, in this modification example, the electrode isolation diffusion layers 51 to 54 have a depth that is substantially equal to the depth of the Hall voltage output electrodes 42 and 44. This configuration allows a current to flow to near the Hall voltage output electrodes 42 and 44, and can achieve a larger width in the depth direction of a current.

That is, the drive current supply electrodes 31, 33, and 35 are preferably as deep as possible in the range of the thickness of the semiconductor layer 20, and the electrode isolation diffusion layers 51 to 54 are preferably as shallow as possible in a range that enables electrode isolation.

As described above, according to this modification example, the magnetic sensitivity can be more improved.

[Second Embodiment]

A Hall element is known to output so-called offset voltage even when no magnetic field is applied thereto. Offset voltage does not cause problems when the offset voltage is small enough and is not required to be removed, but it is required to remove the offset voltage when a magnetic sensor with high accuracy is demanded, for example.

The spinning current technique has been known as a method of removing offset voltage.

In order to perform offset cancellation by the spinning current technique in a vertical Hall element, a plurality of electrodes aligned along a straight line need to be configured so that the role of a drive current supply electrode and the role of a Hall voltage output electrode can be switched alternately, and it is necessary to switch current flow direction.

In the first embodiment described above, however, the drive current supply electrodes are formed to have the depth that is larger than that of the Hall voltage output electrodes, and hence the roles of the drive current supply electrodes and the Hall voltage output electrodes cannot be switched to each other for use.

In view of the above, as a second embodiment of the present invention, there is described a semiconductor device that includes a vertical Hall element capable of performing offset cancellation by the spinning current technique.

Figure 3A:
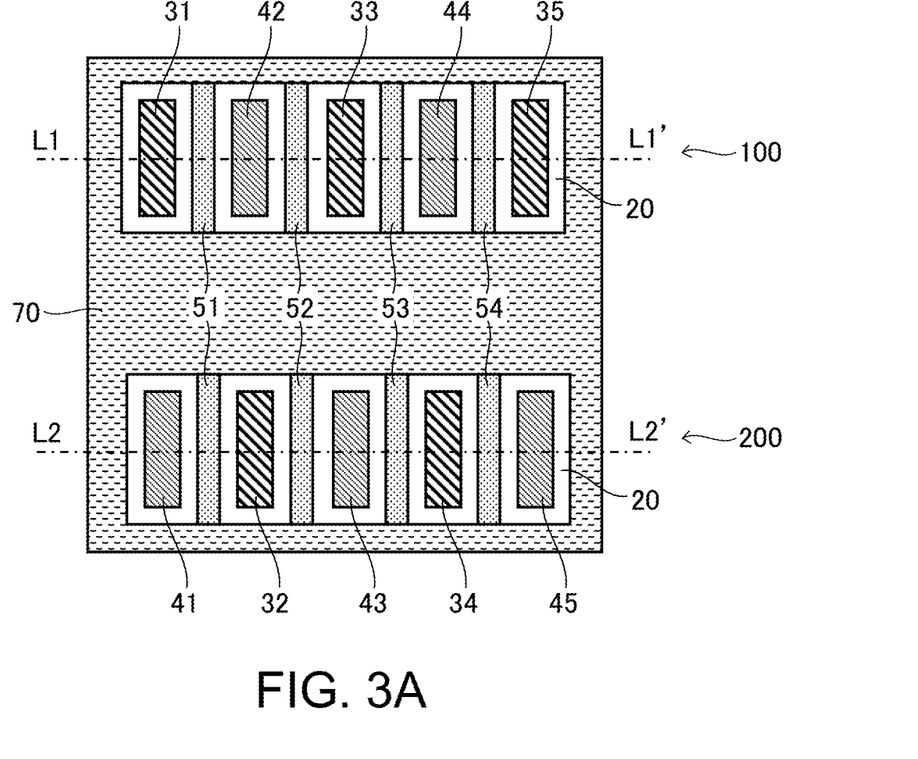
FIG. 3A is a plan view of a semiconductor device that includes a vertical Hall element according to a second embodiment of the present invention.
Figure 3B:
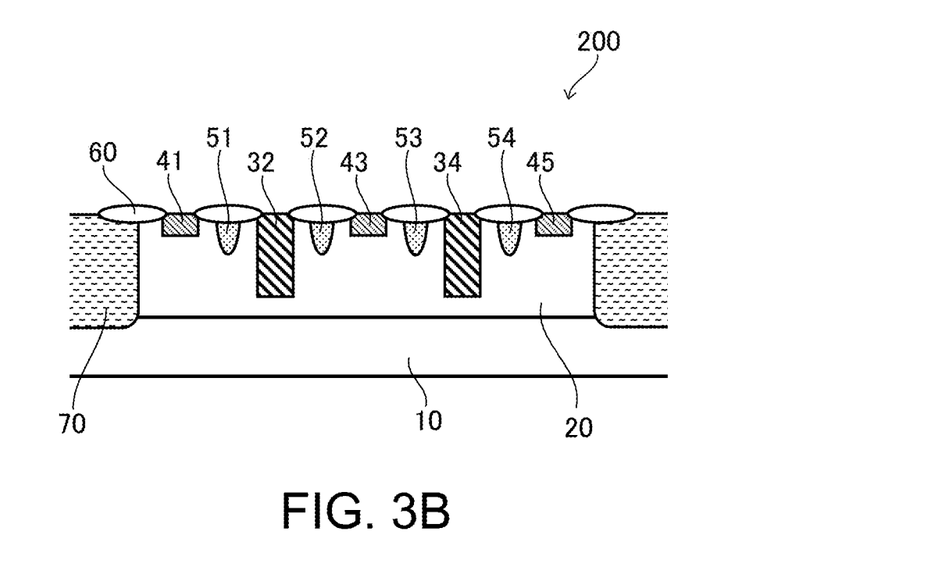
FIG. 3B is a cross-sectional view taken along the line L2-L2' of FIG. 3A.

FIG. 3A is a plan view of the semiconductor device that includes the vertical Hall element according to the second embodiment of the present invention. FIG. 3B is a sectional view taken along the line L2-L2' of FIG. 3A.

The same components as those of the semiconductor device having the vertical Hall element 100 illustrated in FIG. 1A and FIG. 1B are denoted by the same reference numerals, and redundant description will be omitted as appropriate.

The semiconductor device of the second embodiment includes two vertical Hall elements 100 and 200 on the semiconductor substrate 10.

The vertical Hall element 100 has the same configuration as that of the vertical Hall element 100 illustrated in FIG. 1A and FIG. 1B.

Meanwhile, the vertical Hall element 200 has a planar shape illustrated in the lower part of FIG. 3A, and a cross-sectional shape illustrated in FIG. 3B being the cross-sectional view taken along the line L2-L2'.

The vertical Hall element 200 includes an N-type semiconductor layer 20, electrodes 32, 34, 41, 43, and 45, and P-type electrode isolation diffusion layers 51 to 54. The N-type semiconductor layer 20 is formed on the semiconductor substrate 10. The electrodes 32, 34, 41, 43, and 45 are N-type impurity regions that are aligned along a straight line L2-L2' in a surface of the N-type semiconductor layer 20. The P-type electrode isolation diffusion layers 51 to 54 are configured to isolate the electrodes 32, 34, 41, 43, and 45 from one another. That is, the vertical Hall element 200 includes the same number of electrodes as the vertical Hall element 100, which is five.

Of the electrodes 32, 34, 41, 43, and 45, the electrodes 32 and 34 are electrodes that function as drive current supply electrodes, and the electrodes 41, 43, and 45 are electrodes that function as Hall voltage output electrodes. The drive current supply electrodes 32 and 34 and the Hall voltage output electrodes 41, 43, and 45 are alternately aligned along the straight line L2-L2', as illustrated in FIG. 3A.

As illustrated in FIG. 3B, the drive current supply electrodes 32 and 34 are formed to have a depth that is larger than those of the Hall voltage output electrodes 41, 43, and 45 and the electrode isolation diffusion layers 51 to 54.

Further, the drive current supply electrodes 32 and 34 have a concentration that is substantially equal to the concentration of the Hall voltage output electrodes 41, 43, and 45.

The vertical Hall element 200 further includes, as with the vertical Hall element 100, an insulating film, for example, an SiO$_2$ film 60, so as to cover a surface of the N-type semiconductor layer 20, except for regions in which the electrodes 32, 34, 41, 43, and 45 are formed. This suppresses a current that flows in parallel to the semiconductor substrate 10 in the surface of the N-type semiconductor layer 20.

As described above, the vertical Hall element 200 has a configuration in which the drive current supply electrodes 31, 33, and 35 in the vertical Hall element 100 are replaced with the Hall voltage output electrodes 41, 43, and 45, and the Hall voltage output electrodes 42 and 44 in the vertical Hall element 100 are replaced with the drive current supply electrodes 32 and 34.

As a result, in the vertical Hall element 100, the electrodes located on both ends on the straight line L1-L1' are the drive current supply electrodes (31 and 35). In the vertical Hall element 200, on the other hand, the electrodes located on both ends on the straight line L2-L2' are the Hall voltage output electrodes (41 and 45).

Further, the vertical Hall element 100 and the vertical Hall element 200 are arranged so that the straight line L1-L1' and the straight line L2-L2' are parallel to each other.

Here, in the example illustrated in FIG. 3A, the vertical Hall element 100 is arranged on the upper part of the drawing sheet and the vertical Hall element 200 is arranged on the lower part of the drawing sheet, but the arrangement is not limited thereto. Any arrangement may be employed as long as the straight line L1-L1' and the straight line L2-L2' are parallel to each other, and the vertical Hall element 100 and the vertical Hall element 200 may be arranged side by side, for example.

The vertical Hall element 100 and the vertical Hall element 200 are isolated from each other by the element isolation diffusion layer 70.

Elements including transistors and others configuring a circuit for processing signals output from the vertical Hall elements 100 and 200 or supplying signals to the vertical Hall elements 100 and 200 are also formed in a region (not shown) isolated by the element isolation diffusion layer 70. The region may be provided between the vertical Hall element 100 and the vertical Hall element 200 in FIG. 3A, for example.

Now, there is described a method of performing offset cancellation by the spinning current technique in the semiconductor device that includes the two vertical Hall elements 100 and 200 having the above-mentioned configurations.

In the vertical Hall element 100, a voltage that is generated between the Hall voltage output electrodes 42 and 44 when a current flows from the drive current supply electrode 33 to the drive current supply electrodes 31 and 35 is obtained as an output voltage Vout1. Further, a voltage that is generated between the Hall voltage output electrodes 42 and 44 when the current flows in a reverse direction, that is, when the current flows from the drive current supply electrodes 31 and 35 to the drive current supply electrode 33 is obtained as an output voltage Vout2.

Meanwhile, in the vertical Hall element 200, a voltage that is generated between the Hall voltage output electrode 43 and the Hall voltage output electrodes 41 and 45 when a current flows from the drive current supply electrode 32 to the drive current supply electrode 34 is obtained as an output voltage Vout3. Further, a voltage that is generated between the Hall voltage output electrode 43 and the Hall voltage output electrodes 41 and 45 when the current flows in a reverse direction, that is, when the current flows from the drive current supply electrode 34 to the drive current supply electrode 32 is obtained as an output voltage Vout4.

The offset voltage can be removed by adding and subtracting the output voltages Vout1 and Vout2 of the vertical Hall element 100 to or from the output voltages Vout3 and Vout4 of the vertical Hall element 200.

The offset voltage can therefore be removed even when the drive current supply electrodes have the depth that is different from that of the Hall voltage output electrodes, and the plurality of electrodes aligned along the straight line cannot be alternately switched for use between the drive current supply electrode and the Hall voltage output electrode. Specifically, the two vertical Hall elements 100 and 200, one of which includes the deep drive current supply electrodes and the shallow Hall voltage output electrodes that are arranged in a manner opposite to that in the other vertical Hall element, are formed on the same semiconductor substrate 10. This configuration switch current flow direction and switch the roles of the drive current supply electrode and the role of the Hall voltage output electrode to achieve the equivalent use to the spinning current technique. As a result, the offset voltage can be removed.

Further, currents can be supplied to the vertical Hall elements 100 and 200 at the same timing, and hence time for offset voltage removal processing can be shortened as compared to a case in which the spinning current technique is applied to one vertical Hall element. The magnetic field can therefore be detected at a higher speed.

[Third Embodiment]

In the examples of the first and second embodiments described above, the drive current supply electrodes 31 to 35 have the concentration that is substantially equal to the concentration of the Hall voltage output electrodes 41 to 45, and have the depth that is different from that of the Hall voltage output electrodes 41 to 45.

In a third embodiment of the present invention, configuration of drive current supply electrodes is different from configuration of the drive current supply electrodes of the first and second embodiments described above.

For the purpose of easy understanding of the description, there is described an example in which the drive current supply electrodes 31, 33, and 35 of the vertical Hall element 100 of the first embodiment illustrated in FIG. 1A and FIG. 1B are replaced with the drive current supply electrodes having the configuration according to the third embodiment.

Figure 4A:
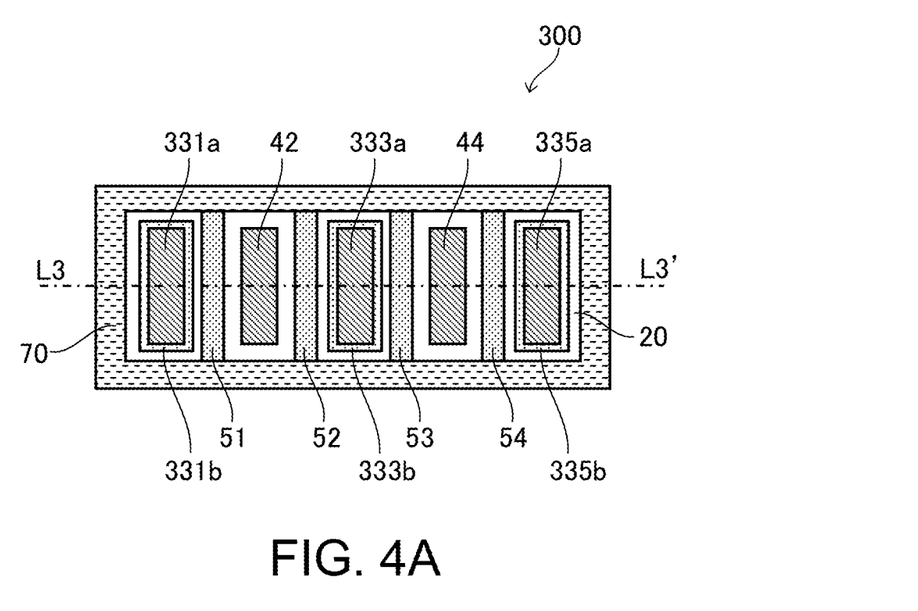
FIG. 4A is a plan view of a semiconductor device that includes a vertical Hall element according to a third embodiment of the present invention.
Figure 4B:
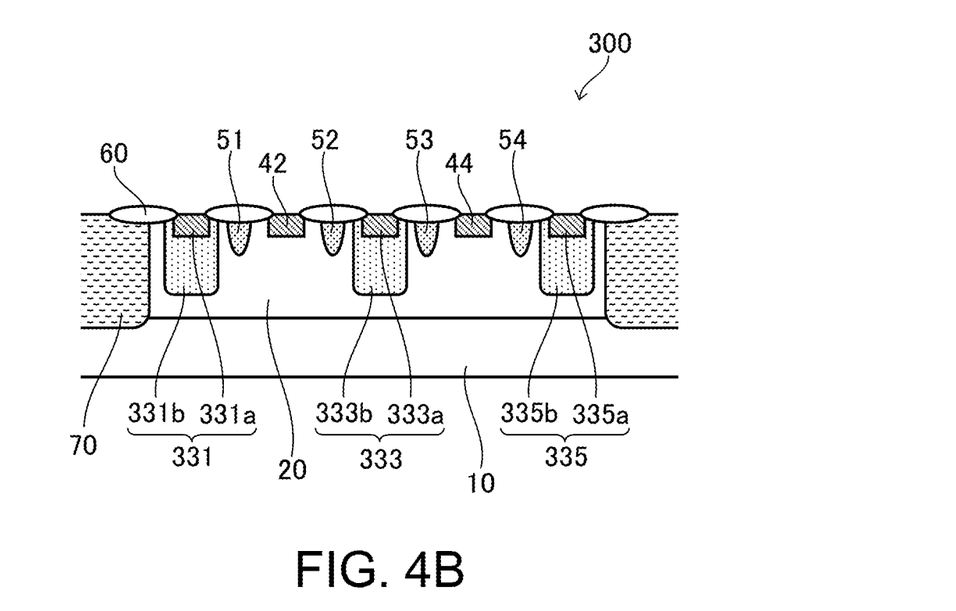
FIG. 4B is a cross-sectional view taken along the line L3-L3' of FIG. 4A.

FIG. 4A and FIG. 4B are views for illustrating a semiconductor device that includes a vertical Hall element 300 according to the third embodiment of the present invention. FIG. 4A is a plan view of the semiconductor device, and FIG. 4B is a sectional view taken along the line L3-L3' of FIG. 4A.

The same components as those of the semiconductor device having the vertical Hall element 100 illustrated in FIG. 1A and FIG. 1B are denoted by the same reference numerals, and redundant descriptions will be omitted as appropriate.

The vertical Hall element 300 includes an N-type semiconductor layer 20, electrodes 331, 333, 335, 42, and 44, and P-type electrode isolation diffusion layers 51 to 54. The N-type semiconductor layer 20 is formed on the semiconductor substrate 10. The electrodes 331, 333, 335, 42, and 44 are N-type impurity regions aligned along a straight line L3-L3' in a surface of the N-type semiconductor layer 20.

The P-type electrode isolation diffusion layers 51 to 54 are configured to isolate the electrodes 331, 333, 335, 42, and 44 from one another.

Of the electrodes 331, 333, 335, 42, and 44, the electrodes 331, 333, and 335 are electrodes that function as drive current supply electrodes, and the electrodes 42 and 44 are electrodes that function as Hall voltage output electrodes. The drive current supply electrodes 331, 333, and 335 and the Hall voltage output electrodes 42 and 44 are alternately aligned along the straight line L3-L3', as illustrated in FIG. 4A.

The drive current supply electrode 331 includes N-type impurity layers 331a and 331b. The drive current supply electrode 333 includes N-type impurity layers 333a and 333b. The drive current supply electrode 335 includes N-type impurity layers 335a and 335b.

The N-type impurity layers 331a, 333a, and 335a are formed in the surface of the N-type impurity layers 331b, 333b, and 335b, respectively, and have substantially the same concentration and depth as those of the Hall voltage output electrodes 42 and 44.

Each of the N-type impurity layers 331b, 333b and 335b is formed to have a depth that is larger than those of the Hall voltage output electrodes 42 and 44 and the electrode isolation diffusion layers 51 to 54. Further, each of the N-type impurity layers 331b, 333b, and 335b has a concentration that is lower than that of the N-type impurity layers 331a, 333a, and 335a and has a width that is larger than that of the N-type impurity layers 331a, 333a, and 335a.

Figure 5:
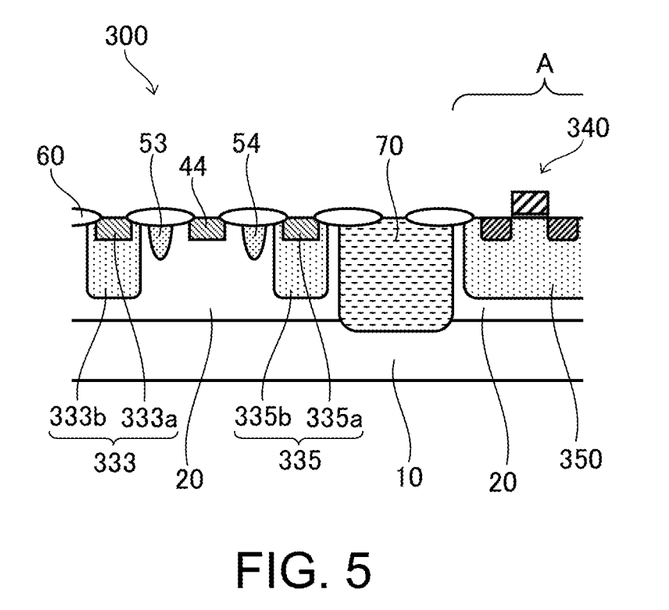
FIG. 5 is another cross-sectional view taken along the line L3-L3' of FIG. 4A.

Meanwhile, as illustrated in FIG. 5, elements including transistors and others configuring a circuit for processing signals output from the vertical Hall element 300 or supplying signals to the vertical Hall element 300 are formed in other region A on the semiconductor substrate 10 that are electrically isolated from the vertical Hall element 300 by the P-type element isolation diffusion layer 70. In the region A, at least one N-well 350 is formed for forming a P-channel transistor 340, for example, as the elements.

Hence, the N-type impurity layers 331b, 333b, and 335b can be formed through processes that are common to the above-mentioned N-well 350. The N-well 350 consequently has substantially the same depth and concentration distribution as that of the N-type impurity layers 331b, 333b, and 335b.

As described above, according to the third embodiment, the drive current supply electrodes 331, 333, and 335 which include the N-type impurity layers 331a, 333a, and 335a and the N-type impurity layers 331b, 333b, and 335b can be formed without an increase in number of manufacturing processes.

The configuration of the drive current supply electrode described in the third embodiment is also applicable to the first embodiment illustrated in FIG. 1A and FIG. 1B, the modification example of the first embodiment illustrated in FIG. 2, and the drive current supply electrodes of the second embodiment illustrated in FIG. 3A and FIG. 3B.

In order to further increase the width in the depth direction of a current, the drive current supply electrodes 331, 333, and 335 according to the third embodiment are also preferably as deep as possible just like the drive current supply electrodes 31, 33, and 35 according to the modification example of the vertical Hall element 100 of the first embodiment illustrated in FIG. 2. In this case, it is preferred that the N-type impurity layers 331b, 333b, and 335b is made a larger depth while the depth of the N-type impurity layers 331a, 333a, and 335a being unchanged.

It is apparent that the present invention is not limited to the above embodiments, but may be modified and changed without departing from the scope and spirit of the invention.

For example, the first conductivity type as the P type and the second conductivity as the N type in the embodiments described above may be switched to set the first conductivity as the N type and the second conductivity as the P type.

The number of electrodes in each of the embodiments described above is five, which is the number of electrodes required to execute offset cancellation processing by the spinning current technique. When the offset voltage can be reduced to a level at which offset cancellation by the spinning current technique is not required, at least three electrodes in total including two electrodes serving as drive current supply electrodes and one electrode serving as a Hall voltage output electrode are therefore sufficient.

Further, in the example of the second embodiment described above, the vertical Hall elements 100 and 200 each include the five electrodes. The spinning current technique can, however, be performed when there are five or more electrodes, and hence the number of electrodes is not limited to five.

What is claimed is:

1. A semiconductor device, comprising:
a semiconductor substrate of a first conductivity type; and
a vertical Hall element formed on the semiconductor substrate,
the vertical Hall element comprising:
a semiconductor layer of a second conductivity type formed on the semiconductor substrate;
a plurality of electrodes aligned along a straight line in a surface of the semiconductor layer, each of the plurality of electrodes comprising an impurity region of the second conductivity type that has a concentration that is higher than the concentration of the semiconductor layer; and
a plurality of electrode isolation diffusion layers of the first conductivity type isolating the plurality of electrodes from one another, each of the plurality of electrode isolation diffusion layers being provided between each pair of the plurality of electrodes in the surface of the semiconductor layer,
the plurality of electrodes comprising a drive current supply electrode and a Hall voltage output electrode, the drive current supply electrode and the Hall voltage output electrode being arranged alternately,
the Hall voltage output electrode having a first depth, and the drive current supply electrode having a second depth that is larger than the first depth and a depth of the plurality of electrode isolation diffusion layers.

2. The semiconductor device according to claim 1, wherein the drive current supply electrode has a concentration that is substantially equal to a concentration of the Hall voltage output electrode.

3. The semiconductor device according to claim 1, wherein the drive current supply electrode comprises:
a first impurity layer of the second conductivity type having the second depth; and
a second impurity layer of the second conductivity type provided in a surface of the first impurity layer and having the first depth and a concentration that is higher than the concentration of the first impurity layer.

4. The semiconductor device according to claim 3, wherein the second impurity layer has a concentration that is substantially equal to the concentration of the Hall voltage output electrode.

5. The semiconductor device according to claim 1, wherein the plurality of electrode isolation diffusion layers have the depth that is substantially equal to the first depth.

6. The semiconductor device according to claim 1, wherein the drive current supply electrode has the second depth that is substantially equal to the depth of the semiconductor layer.

7. The semiconductor device according to claim 1, wherein the semiconductor layer comprises an epitaxial layer.

8. The semiconductor device according to claim 1, wherein the surface of the semiconductor layer and surfaces of the plurality of electrode isolation diffusion layers are covered with an insulating film, except for regions in which the plurality of electrodes are formed.

9. The semiconductor device according to claim 1, wherein a number of the control current supply electrode is at least two, and a number of the Hall voltage output electrode is at least one.

10. A semiconductor device, comprising:
a semiconductor substrate of a first conductivity type; and
a first vertical Hall element formed on the semiconductor substrate; and
a second vertical Hall element formed on the semiconductor substrate,
the first vertical Hall element comprising:
a first semiconductor layer of a second conductivity type formed on the semiconductor substrate;
a plurality of first electrodes aligned along a first straight line in a surface of the semiconductor layer, each of the plurality of first electrodes comprising a first impurity region of the second conductivity type that has a concentration that is higher than the concentration of the semiconductor layer; and
a plurality of first electrode isolation diffusion layers of the first conductivity type isolating the plurality of first electrodes from one another, each of the plurality of first electrode isolation diffusion layers being provided between each pair of the plurality of first electrodes in the surface of the semiconductor layer,
the plurality of first electrodes comprising a first drive current supply electrode and a first Hall voltage output electrode, the first drive current supply electrode and the first Hall voltage output electrode being arranged alternately,
the Hall voltage output electrode having a first depth, and
the drive current supply electrode having a second depth that is larger than the first depth and a depth of the plurality of electrode isolation diffusion layers,
the second vertical Hall element comprising:
a second semiconductor layer of the second conductivity type formed on the semiconductor substrate;
a plurality of second electrodes aligned along a second straight line in a surface of the semiconductor layer, each of the plurality of second electrodes comprising a second impurity region of the second conductivity type that has a concentration that is higher than the concentration of the semiconductor layer; and
a plurality of second electrode isolation diffusion layers of the first conductivity type isolating the plurality of second electrodes from one another, each of the plurality of second electrode isolation diffusion layers being provided between each pair of the plurality of second electrodes in the surface of the semiconductor layer,
the plurality of second electrodes comprising a second drive current supply electrode and a second Hall voltage output electrode, the second drive current supply electrode and the second Hall voltage output electrode being arranged alternately,
the Hall voltage output electrode having the first depth, and
the drive current supply electrode having the second depth, wherein
a number of the plurality of first electrodes in the first vertical Hall element and a number of the plurality of second electrodes in the second vertical Hall element are the same,
the first vertical Hall element comprises two drive current supply electrodes respectively located on both ends on the first straight line,
the second vertical Hall element comprises two Hall voltage output electrodes respectively located on both ends on the second straight line, and
the first straight line in the first vertical Hall element and the second straight line in the second vertical Hall element are parallel to each other.

11. The semiconductor device according to claim 3, further comprising:
an element isolation diffusion layer of the first conductivity type electrically isolating the vertical Hall element from surroundings of the vertical Hall element, the element isolation diffusion layer surrounding the vertical Hall element; and
an element formation region provided periphery of the element isolation diffusion layer and in which an element of a circuit for processing of a signal output from the vertical Hall element and supply of a signal to the vertical Hall element is formed, wherein
the element formation region comprises a well of the second conductivity type, and
the well has a depth and a concentration distribution that are substantially equal to the depth and the concentration distribution of the first impurity layer.

* * * * *